United States Patent
Cheng et al.

(10) Patent No.: US 8,932,932 B2
(45) Date of Patent: Jan. 13, 2015

(54) HIGHLY SCALABLE TRENCH CAPACITOR

(71) Applicant: International Business Machines Corporation, Armonk, NY (US)

(72) Inventors: Kangguo Cheng, Guilderland, NY (US); Johnathan E. Faltermeier, Delanson, NY (US); Anne Marie Kimball, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 13/803,281

(22) Filed: Mar. 14, 2013

(65) Prior Publication Data
US 2013/0203234 A1    Aug. 8, 2013

Related U.S. Application Data

(62) Division of application No. 12/689,501, filed on Jan. 19, 2010, now Pat. No. 8,492,817.

(51) Int. Cl.
| | |
|---|---|
| *H01L 29/92* | (2006.01) |
| *H01L 21/02* | (2006.01) |
| *H01L 49/02* | (2006.01) |
| *H01L 27/108* | (2006.01) |
| *H01L 29/66* | (2006.01) |
| *H01L 21/768* | (2006.01) |

(52) U.S. Cl.
CPC .......... *H01L 28/40* (2013.01); *H01L 27/10861* (2013.01); *H01L 29/66181* (2013.01); *H01L 21/7682* (2013.01); *H01L 21/76831* (2013.01)
USPC ........... 438/386; 438/592; 438/243; 257/301; 257/305; 257/321; 257/E29.343; 257/E21.008

(58) Field of Classification Search
USPC .......... 438/386, 592, 243; 257/301–305, 321, 257/532, E29.343, E21.008
See application file for complete search history.

(56) References Cited

U.S. PATENT DOCUMENTS

| | | | |
|---|---|---|---|
| 5,482,883 | A | 1/1996 | Rajeevakumar |
| 6,008,104 | A | 12/1999 | Schrems |
| 6,268,299 | B1 | 7/2001 | Jammy et al. |
| 6,423,607 | B1 | 7/2002 | Heineck et al. |
| 6,555,430 | B1 | 4/2003 | Chudzik et al. |
| 6,605,838 | B1 | 8/2003 | Mandelman et al. |
| 6,746,933 | B1 | 6/2004 | Beintner et al. |
| 6,893,938 | B2 | 5/2005 | Naeem et al. |
| 6,960,514 | B2 | 11/2005 | Beintner et al. |
| 7,170,126 | B2 | 1/2007 | Cheng et al. |
| 2003/0181006 | A1 * | 9/2003 | Schrems ....................... 438/243 |
| 2004/0173858 | A1 | 9/2004 | Beintner et al. |
| 2004/0209486 | A1 | 10/2004 | Naeem et al. |
| 2005/0059214 | A1 | 3/2005 | Cheng et al. |

(Continued)

*Primary Examiner* — Cathy N Lam
(74) *Attorney, Agent, or Firm* — Joseph P. Abate; Howard H. Cohn

(57) ABSTRACT

An improved trench structure, and method for its fabrication are disclosed. Embodiments of the present invention provide a trench in which the collar portion has an air gap instead of a solid oxide collar. The air gap provides a lower dielectric constant. Embodiments of the present invention can therefore be used to make higher-performance devices (due to reduced parasitic leakage), or smaller devices, due to the ability to use a thinner collar to achieve the same performance as a thicker collar comprised only of oxide (with no air gap). Alternatively, a design choice can be made to achieve a combination of improved performance and reduced size, depending on the application.

7 Claims, 8 Drawing Sheets

(56) References Cited

U.S. PATENT DOCUMENTS

| | | |
|---|---|---|
| 2005/0093044 A1 | 5/2005 | Cheng et al. |
| 2005/0285175 A1 | 12/2005 | Cheng et al. |
| 2007/0117307 A1 | 5/2007 | Cheng et al. |
| 2007/0189057 A1 | 8/2007 | Cheng et al. |
| 2007/0210363 A1 | 9/2007 | Cheng et al. |
| 2007/0235786 A1* | 10/2007 | Kapteyn et al. ............. 257/301 |
| 2008/0001196 A1 | 1/2008 | Cheng et al. |
| 2008/0064162 A1 | 3/2008 | Cheng et al. |
| 2011/0076831 A1 | 3/2011 | Chen |

* cited by examiner

HIGHLY SCALABLE TRENCH CAPACITOR

CROSS REFERENCE TO RELATED APPLICATIONS

This application is a division of commonly-owned, U.S. patent application Ser. No. 12/689,501 entitled HIGHLY SCALABLE TRENCH CAPACITOR and filed on Jan. 19, 2010. application Ser. No. 12/691,183 claims the benefit of provisional application Ser. No. 61/152,282 filed on Feb. 13, 2009.

FIELD OF THE INVENTION

The present invention relates generally to semiconductor fabrication. More specifically, the present invention relates to trench structures, and fabrication methods for trench structures.

BACKGROUND OF THE INVENTION

A trench capacitor is a common element in various semiconductor devices, such as DRAM devices, for example. Dynamic random-access memory (DRAM) cells are composed of two main components, a storage capacitor that is used to stores electronic charge and an access transistor that is used to transfer the electronic charge to and from the storage capacitor.

The storage capacitor may be either planar on the surface of the semiconductor substrate or trench etched into the semiconductor substrate. In the semiconductor industry where there is an increased demand for memory storage capacity accompanied with an ever decreasing chip size, the trench storage capacitor layout is favored over the planar type, and is the prevailing design choice today.

A trench DRAM cell comprises a trench capacitor and a transistor. The trench capacitor typically is comprised of a cavity etched into the substrate, a first electrode—often referred as a "buried plate"—in the substrate, a second electrode in the trench, a thin node dielectric which separates those two electrodes. The transistor is formed above the trench capacitor. A dielectric isolation collar is formed in the upper region of the trench to suppress undesired parasitic leakage between the transistor and the capacitor. The collar is an important part of the DRAM cell, as it serves to prevent the effects of undesired parasitic leakage from occurring.

To compensate for the effects of the undesired parasitic leakage, the collar must be sufficiently thick to prevent the undesired parasitic leakage from having a significant effect on the circuitry of the semiconductor device. As the feature size scales down, this causes a reduction in the amount of trench conductor that can be used, thereby increasing the trench resistance, and reducing the performance of the device. Therefore, it is needed to have an improved trench capacitor that is highly scalable, while still providing high performance for today's electronic devices.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1:
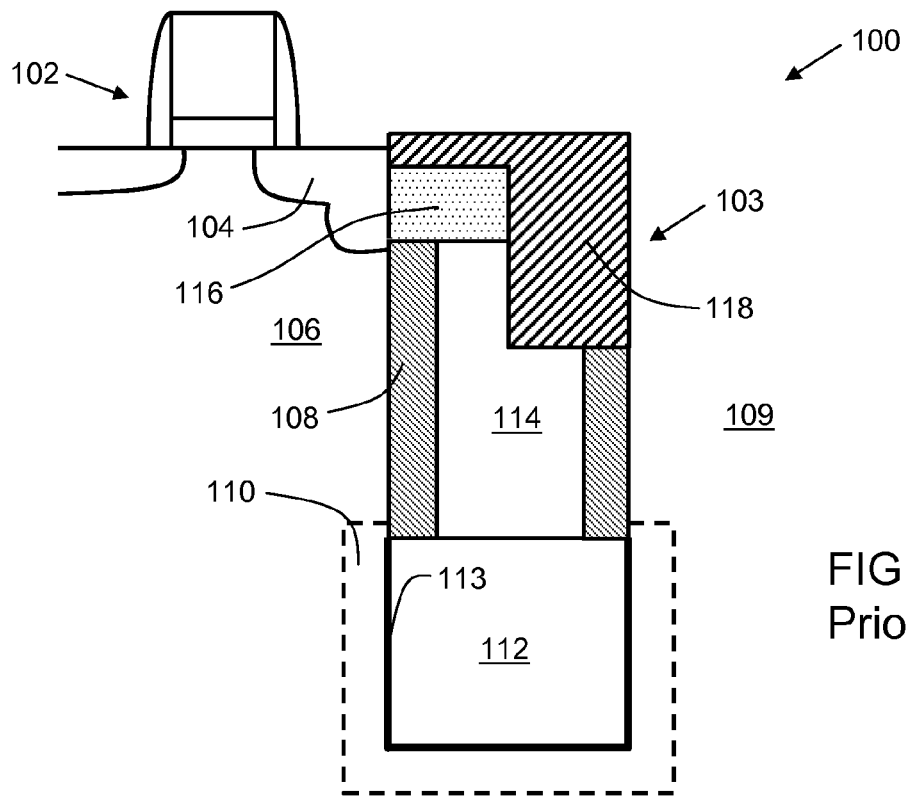

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIG. 1 illustrates a prior art trench capacitor.

Figure 2:
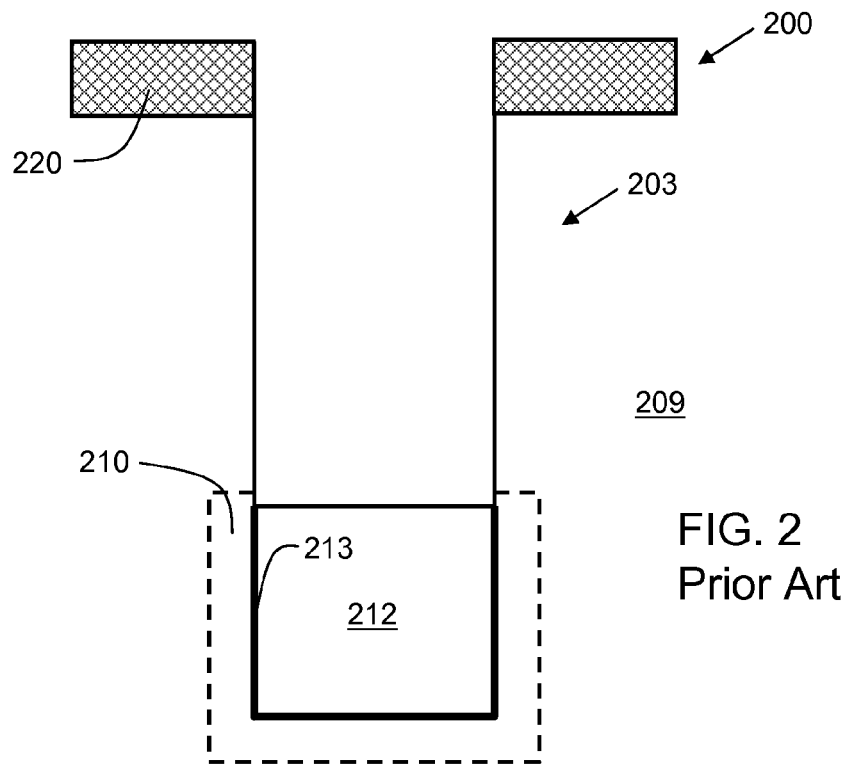

FIG. 2 illustrates a partially completed prior art trench capacitor.

FIGS. 3-11 illustrate various processing steps for making a trench capacitor in accordance with an embodiment of the present invention.

Figure 12:
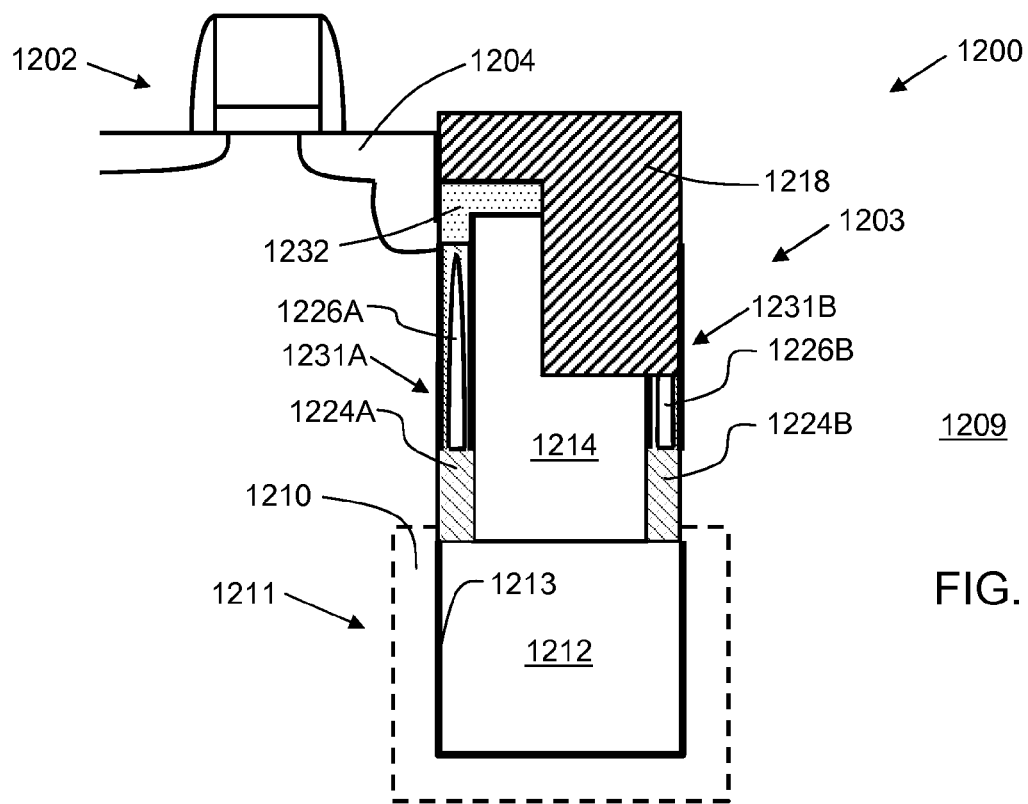

FIG. 12 illustrates a trench capacitor in accordance with an embodiment of the present invention.

Figure 13:
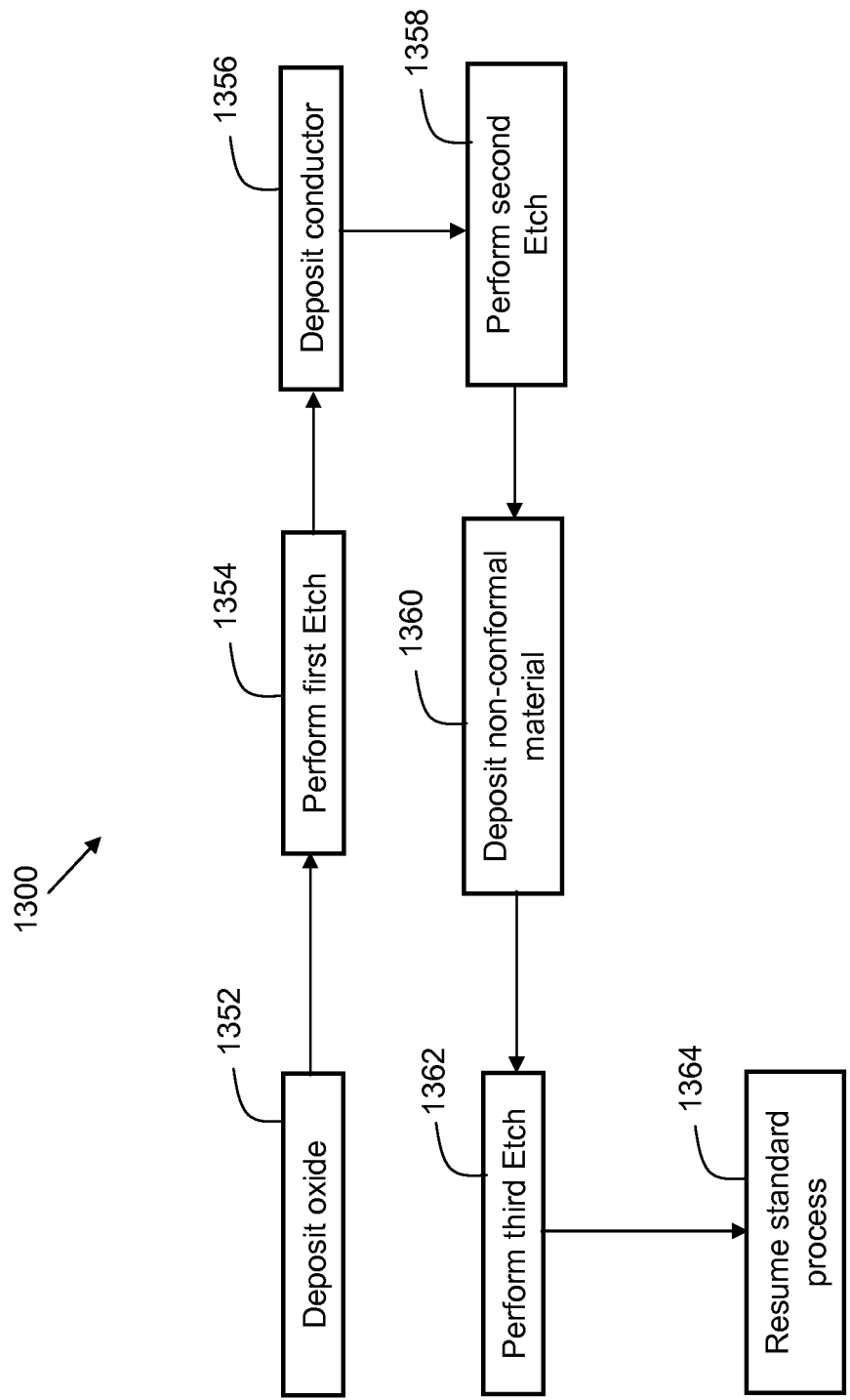
Figure 14:
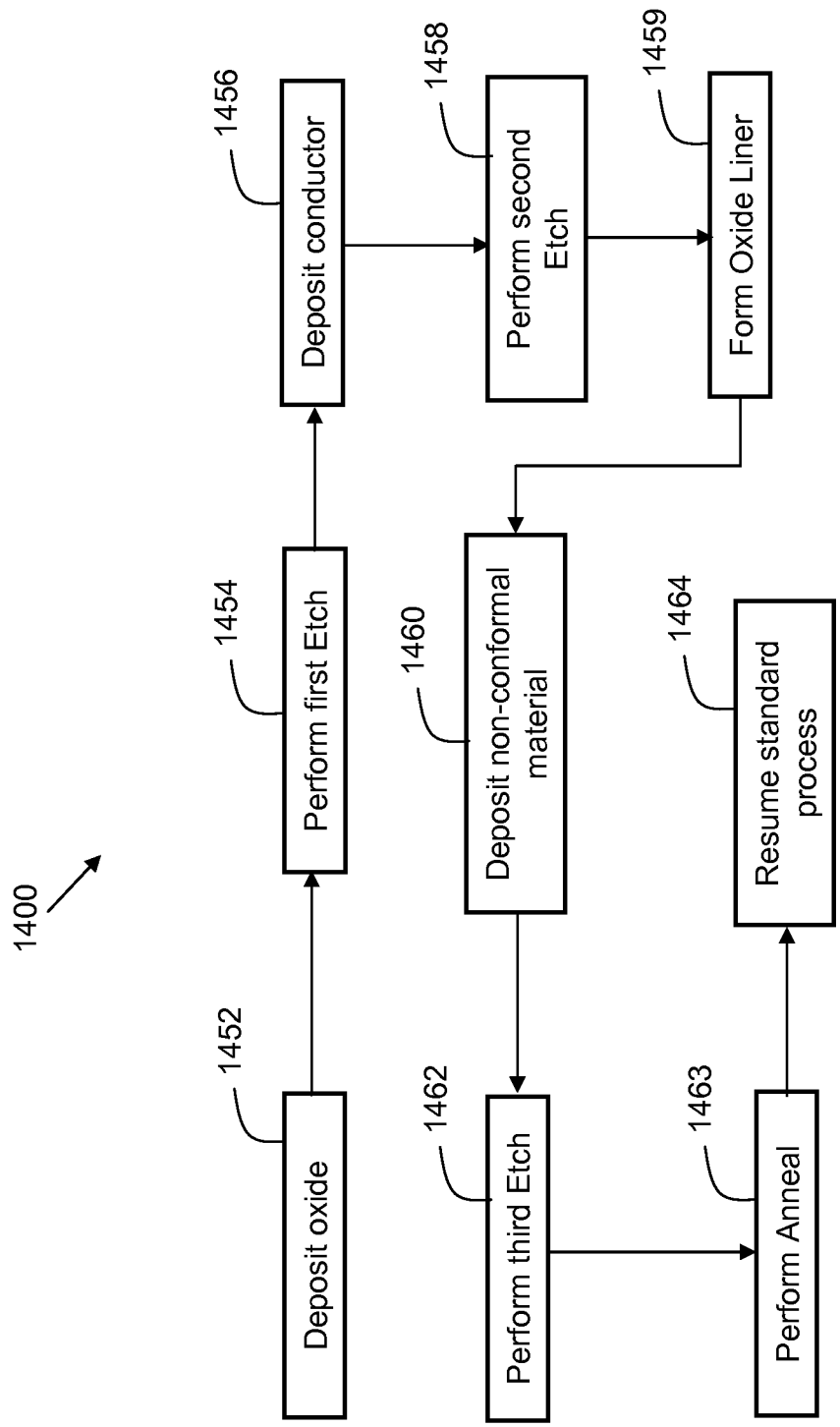

FIG. 13 and FIG. 14 are flowcharts illustrating process steps to fabricate the trench capacitor in accordance with an embodiment of the present invention.

SUMMARY OF THE INVENTION

Embodiments of the present invention provide a trench structure comprising: a cavity within a semiconductor substrate, the cavity filled with a trench conductor; and a collar disposed around the trench conductor, the collar comprising an inner wall and an outer wall, and wherein the collar is comprised of an insulator, and an air gap, that is disposed between the inner wall and outer wall of the collar.

Additional embodiments of the present invention provide a capacitor disposed at the base of the cavity.

Additional embodiments of the present invention provide a trench conductor that is comprised of a material selected from the group consisting of polysilicon, tungsten, titanium, ruthenium, titanium nitride, tantalum nitride, and tungsten silicide.

Additional embodiments of the present invention provide a trench structure wherein the collar has a thickness that ranges from about 5 nanometers to about 30 nanometers.

Additional embodiments of the present invention provide a trench structure comprising an oxide liner disposed on the outer wall of said collar.

Additional embodiments of the present invention provide a trench structure wherein the oxide liner is disposed on the trench conductor.

Additional embodiments of the present invention provide a trench structure wherein the insulator is comprised of oxide.

Additional embodiments of the present invention provide an integrated circuit comprising: a transistor, the transistor comprising a buried strap; a trench structure, comprising a capacitor formed at the base of the trench structure; a first trench conductor disposed within the trench structure, forming an electrical connection with the capacitor; a second trench conductor disposed within the trench structure, forming an electrical connection with said first trench conductor; a collar disposed around the second trench conductor, the collar comprising an inner wall and an outer wall, the collar being comprised of an insulator, and further comprising a cavity within the collar; a third trench conductor disposed within the trench structure, forming an electrical connection with the second trench conductor, and wherein third trench conductor also forms an electrical connection with said buried strap of said transistor, thereby providing an electrical connection from the transistor to the capacitor, whereby the cavity within the collar reduces parasitic leakage currents.

Additional embodiments of the present invention provide an integrated circuit wherein the first trench conductor is comprised of a material selected from the group consisting of polysilicon, tungsten, titanium, ruthenium, titanium nitride, tantalum nitride, and tungsten silicide.

Additional embodiments of the present invention provide an integrated circuit wherein the collar has a thickness that ranges from about 5 nanometers to about 30 nanometers.

Additional embodiments of the present invention provide an integrated circuit comprise an oxide liner disposed the outer wall of said collar.

Additional embodiments of the present invention provide an integrated circuit wherein the oxide liner is further disposed on the second trench conductor.

Additional embodiments of the present invention provide an integrated circuit wherein the insulator is comprised of oxide.

Additional embodiments of the present invention provide a method for fabricating a trench structure comprising the steps of: forming spacers on trench sidewalls on a trench within a substrate; depositing a trench conductor within the trench, whereby the trench conductor is disposed between the spacers; removing a portion of the spacers; and depositing a non-conformal material, thereby forming a collar, the collar comprising an inner wall and an outer wall, and wherein the collar comprises a cavity disposed between the inner wall and outer wall of the collar; and removing a portion of the non-conformal material.

Additional embodiments of the present invention provide a method for fabricating a trench structure further comprising the step of forming an oxide liner on the trench conductor, and the outer wall of said collar.

Additional embodiments of the present invention provide a method for fabricating a trench structure, wherein the step of forming spacers on trench sidewalls comprises the steps of: depositing an oxide within the trench; and performing a first etch of the oxide.

Additional embodiments of the present invention provide a method for fabricating a trench structure, wherein the step of depositing a non-conformal material is performed via chemical vapor deposition.

Additional embodiments of the present invention provide a method for fabricating a trench structure, further comprising the step of performing a thermal anneal at a temperature ranging from about 850 degrees Centigrade to about 1000 degrees Centigrade for a duration ranging from about 10 minutes to about 1 hour.

Additional embodiments of the present invention provide a method for fabricating a trench structure, wherein the step of performing a thermal anneal is performed after the step of removing a portion of the non-conformal material.

Additional embodiments of the present invention provide a method for fabricating a trench structure, wherein the step of performing a thermal anneal is performed before the step of removing a portion of the non-conformal material.

DETAILED DESCRIPTION

To provide context for the present invention, a prior art device shown in FIG. 1 will be briefly described. FIG. 1 shows circuit 100 comprised of transistor 102, and trench structure 103. Trench structure 103 is formed by making a cavity in semiconductor substrate 109. At the base of trench structure 103 is a region of doped polysilicon 112. Surrounding the polysilicon 112 is a region of doped silicon, referred to as buried plate 110. Between the buried plate 110 and doped polysilicon 112 is node dielectric 113. Therefore, a capacitor is formed in which buried plate 110 forms a first electrode of the capacitor, and polysilicon 112 forms a second electrode of the capacitor. Transistor 102 has buried strap 104, which make an electrical connection to the capacitor via polysilicon region 116 and polysilicon region 114.

Collar 108 is used to prevent the effects of the so-called "parasitic FET" from occurring. In particular, the parasitic FET can form when the voltage in polysilicon region 114 of causes a leakage current to form between the buried strap 104 and buried plate 110.

To compensate for this, the collar 108, formed of oxide in the current art, is made sufficiently thick to reduce the leakage current sufficiently to avoid adversely affecting the circuitry of the semiconductor device. As the feature size scales down, this causes a reduction in the amount of material that can be used in region 114, thereby increasing the trench resistance, and reducing the performance of the device.

Embodiments of the present invention address this problem by using an air-gap collar. The air has a lower dielectric constant (k value) than oxide, and hence, the air gap collar of embodiments of the present invention can be thinner than an oxide collar used in the prior art. This allows for more conductive trench material, lowering the resistance, and improving the performance of the semiconductor device (e.g., DRAM, or other integrated circuit). Note that while the term "air gap" or "air cavity" is commonly used in the industry, in actuality these gaps are really "vacuum cavities," similar in concept to a light bulb.

FIG. 2 shows a partially fabricated circuit 200. To make embodiments of the present invention, current industry standard processes are used up to the point shown in FIG. 2. At this point, trench structure 203 is a cavity that is formed in a semiconductor substrate 209. A conductor 212 in the trench, buried plate 210, and node dielectric 213 are in place. Note that as previously stated, similar elements may be referred to by similar numbers in various figures (FIGs) of the drawing, in which case typically the last two significant digits may be the same. For example, polysilicon 212 of FIG. 2 is similar to polysilicon 112 of FIG. 1.

Pad layer 220 is used as a protective layer during the fabrication process. Pad layer is typically a nitride layer or a nitride layer with an underlying oxide layer, to facilitate device formation such as serving as etch stop layer or polish step layer in certain applications.

The semiconductor substrate 209 may comprise a material selected from, but not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, and other compound semiconductor materials. For example, the semiconductor material may comprise single crystalline silicon. Various portions of the semiconductor substrate 209 may be doped appropriately for optimal device performance with p-type dopants and/or n-type dopants. Node dielectric 213 may comprise any now known or later developed dielectric material appropriate for forming a trench capacitor, e.g., silicon oxide, silicon nitride, silicon oxynitride, high-k material having a relative permittivity above about 8, or any combination of these materials. Examples of high-k material include but are not limited to hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, and any combination of these materials.

Figure 3:
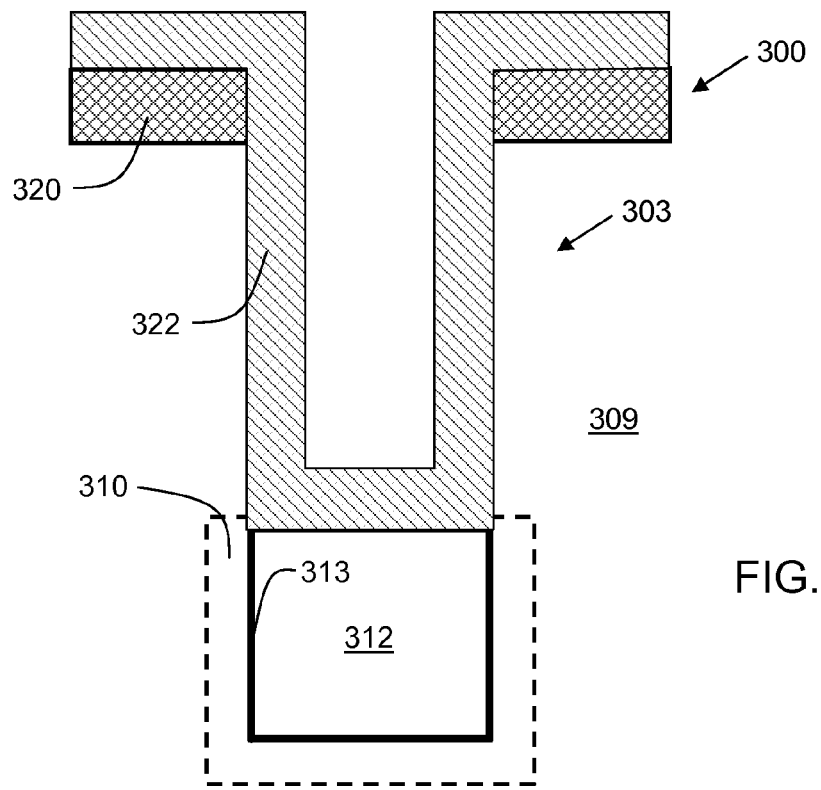

FIG. 3 shows the first step of a method for making embodiments of the present invention, which comprises depositing a dielectric material 322 on trench sidewalls, trench bottom, and on top surface of the pad nitride 320. The dielectric material 322 is typically an insulator material. Examples of the dielectric material 322 include but are not limited to, oxide, nitride, oxynitride, low-k material, or any combination of those and other materials. The dielectric material 322 can be deposited by any suitable deposition methods, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), physical vapor deposition, sputtering, evaporation, ion beam deposition, electron beam deposition, laser assisted deposition, and chemical solution deposition. In one embodiment, the dielectric material 322 comprises silicon oxide formed by ozone/TEOS deposition. In another embodiment, the dielectric material 322 comprises silicon oxide conformally deposited by LPCVD. The thickness of the dielectric material 322 on trench sidewall ranges from about 5 nanometers to 30 nanometers, although greater or lesser thickness of the dielectric material 322 is also contemplated herein. Oxide is used as an example of the dielectric material 322 in the description thereafter.

Figure 4:
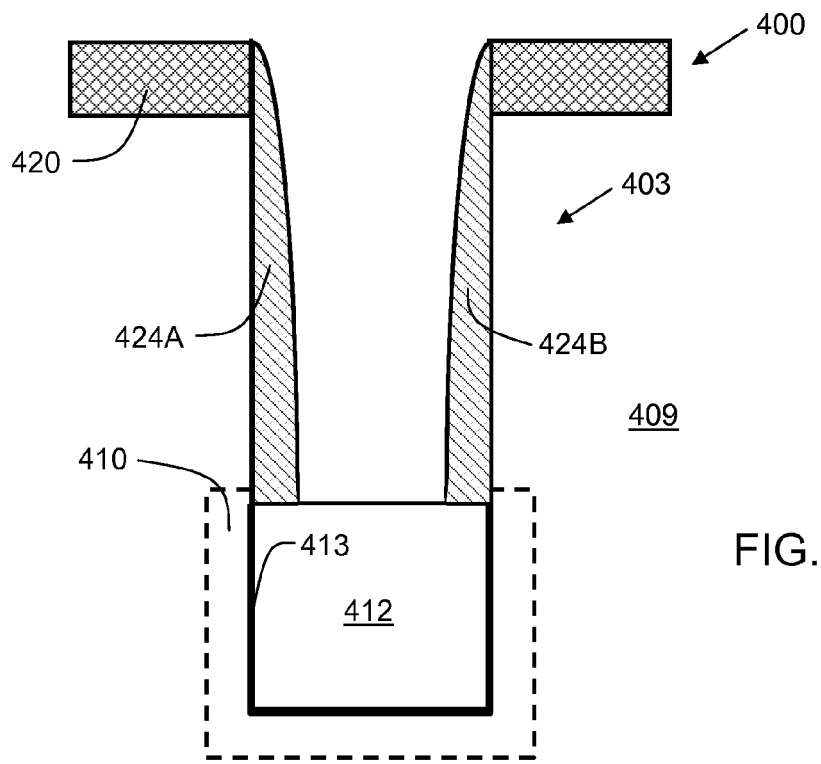

FIG. 4 shows a partially fabricated circuit 400 after a subsequent processing. In this step, the oxide 322 (of FIG. 3) has been etched, typically via an RIE (reactive ion etch) to form spacers 424A and 424B.

Figure 5:
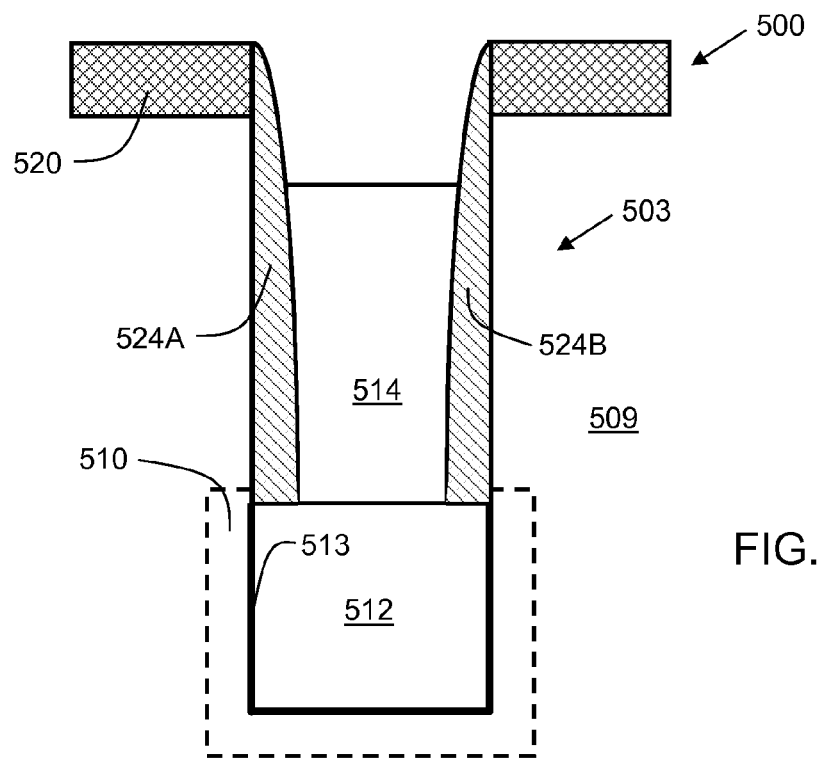

FIG. 5 shows a partially fabricated circuit 500 after a subsequent processing step. In this step, a trench conductor 514 is formed in between spacers 524A and 524B by deposition followed by a recess process such as RIE. The trench conductor 514 may comprise the same conducting material as the trench conductor 512. Alternatively, the trench conductor 514 may comprise a different conducting material than the trench conductor 512. In one embodiment, trench conductor 514 comprises doped polysilicon. However, trench conductor 514 may comprise any conducting material, including but not limited to, amorphous or polycrystalline silicon, germanium, silicon germanium, a metal (e.g., W, Ti, Ru), a conducting metallic compound material (e.g., TiN, TaN, WSi (Tungsten Silicide)), carbon nanotube, conductive carbon, or any suitable combination of these materials. The conductive material may further comprise dopants that are incorporated during or after deposition.

Figure 6:
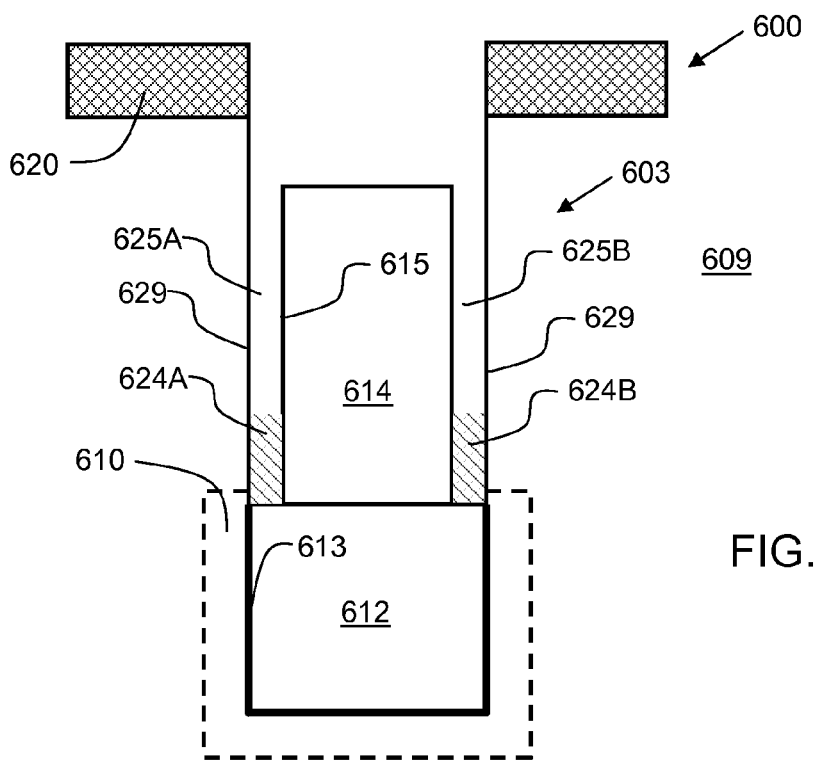

FIG. 6 shows a partially fabricated circuit 600 after a subsequent processing step. In this step, an etch is performed, reducing the size of spacers 624A and 624B (compare to 524A and 524B of FIG. 5) and creating recess areas 625A and 625B in between the trench wall 629 and trench conductor 614. Spacers 624A and 624B serve as an insulator at the base of the collar. The trench wall 629 will serve as the outer wall of the collar, and the side wall 615 of trench conductor 614 will serve as the inner wall of the collar.

Figure 7:
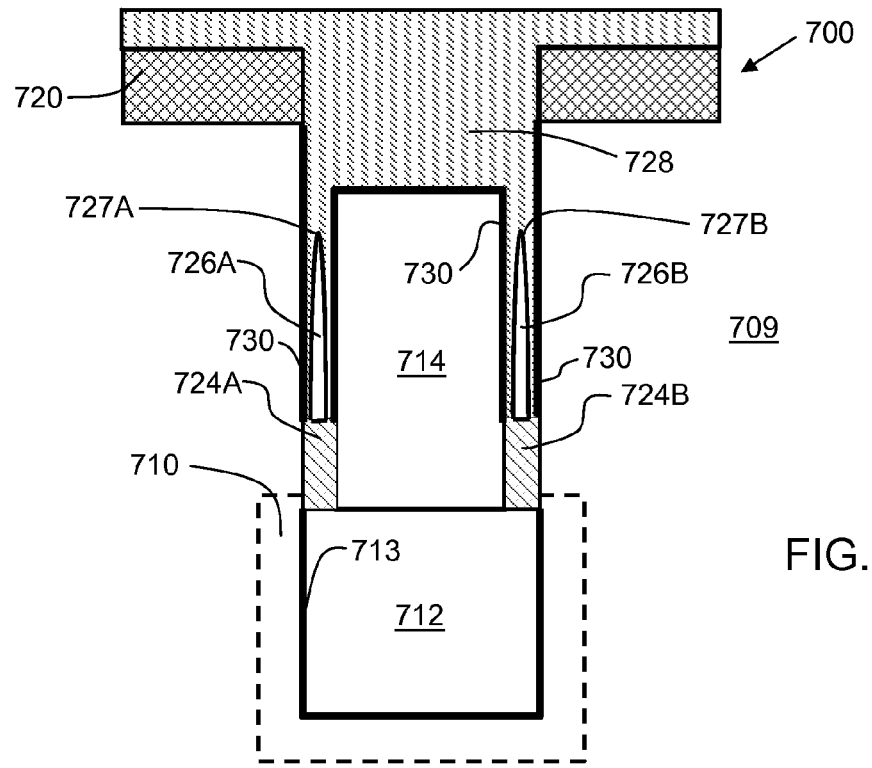

FIG. 7 shows a partially fabricated circuit 700 after subsequent processing steps. At this point, a non-conformal material 728 is deposited. The inherent properties of the non-conformal material are such that it does not completely conform to the surface on which it is being deposited, thereby forming cavities, also referred to as so-called air gaps 726A and 726B. The top portion of air gap 726A and 726B is referred to as the "pinch off" point, and is indicated as 727A and 727B respectively. The non-conformal material is typically a dielectric material such as silicon oxide, silicon nitride, or silicon oxynitride deposited by CVD deposition or ozone/TEOS deposition. Optionally, an oxide liner 730 is formed prior to the deposition of non-conformal material 728. The oxide liner 730 is useful for improving the interface quality between the collar and adjacent materials, resulting in fewer defects between the collar and the materials that contact the collar. In one embodiment, the liner 730 is oxide formed by thermal oxidation.

Figure 8:
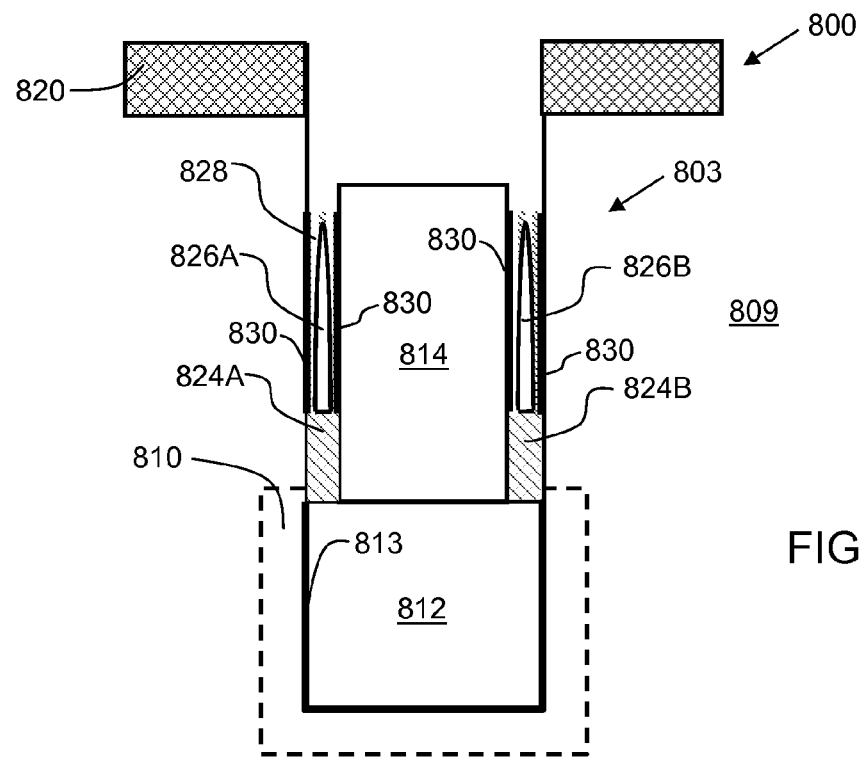

FIG. 8 shows a partially fabricated circuit 800 after a subsequent processing step. In this step, the non-conformal material 828 is etched back to co-planar or below the top of trench conductor 814 (compare to 728 of FIG. 7). However, the etch is timed such that it does not proceed beyond the pinch off points (727A and 727B of FIG. 7), thereby preserving the integrity of the air gaps 826A and 826B in the remaining non-conformal material 828. In one embodiment, the non-conformal material 828 comprises silicon oxide and is etched back by RIE. Part of the oxide liner 830, when present, can also be removed from during or after the etching back of the non-conformal material 828. Optionally, an annealing process can be performed before or after the etch step to improve the quality of the non-conformal material. The annealing process may be performed in an environment containing nitrogen, helium, hydrogen, and/or argon. The annealing temperature may range from about 600-1200 degree Centigrade. The annealing duration may range from 1 second to 10 hours, depending on the annealing temperature. Preferably, the annealing process is performed at about 850-1000 degrees Centigrade for a time ranging from about 10 minutes to about 1 hour. In one embodiment, the annealing process is performed in an environment containing argon at 1000 degrees Centigrade for 30 minutes.

Figure 9:
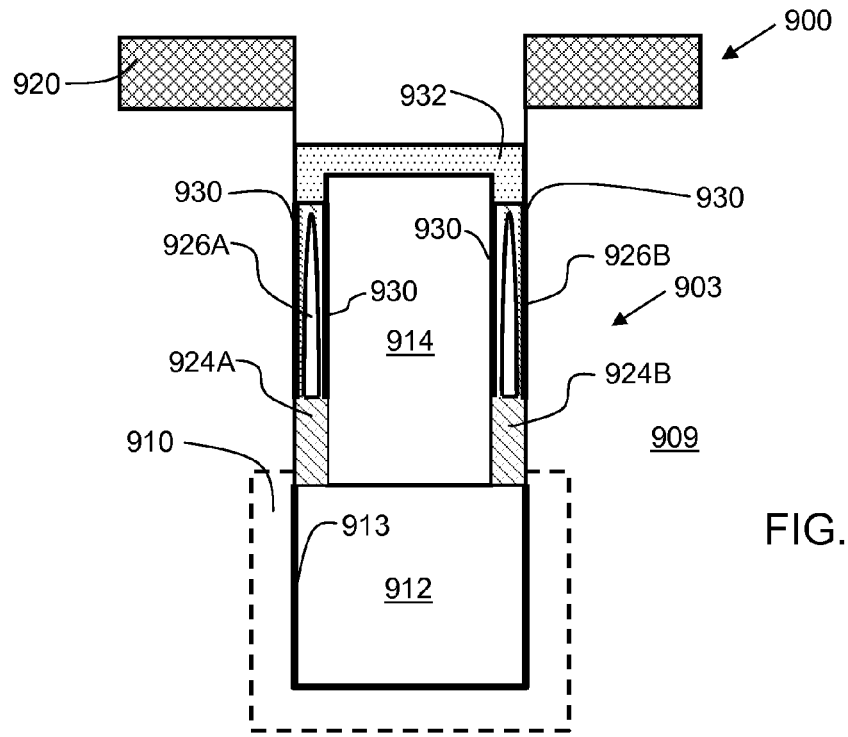

FIG. 9 shows a partially fabricated circuit 900 after a subsequent processing step. In this step, an additional trench conductor 932 is formed by deposition, followed by a recess process such as RIE. Materials and deposition methods for forming conductive materials 912 and 914 can be used for forming the trench conductor 932. In one embodiment, the trench conductor 932 comprises doped polysilicon. Dopants in the polysilicon will diffuse into the substrate to form a buried strap in subsequent thermal anneal process(es). If the trench conductor 932 does not contain dopants, dopants may be introduced into the buried strap, for example, by ion implantation, plasma doping, or by gas phase doping.

Figure 10:
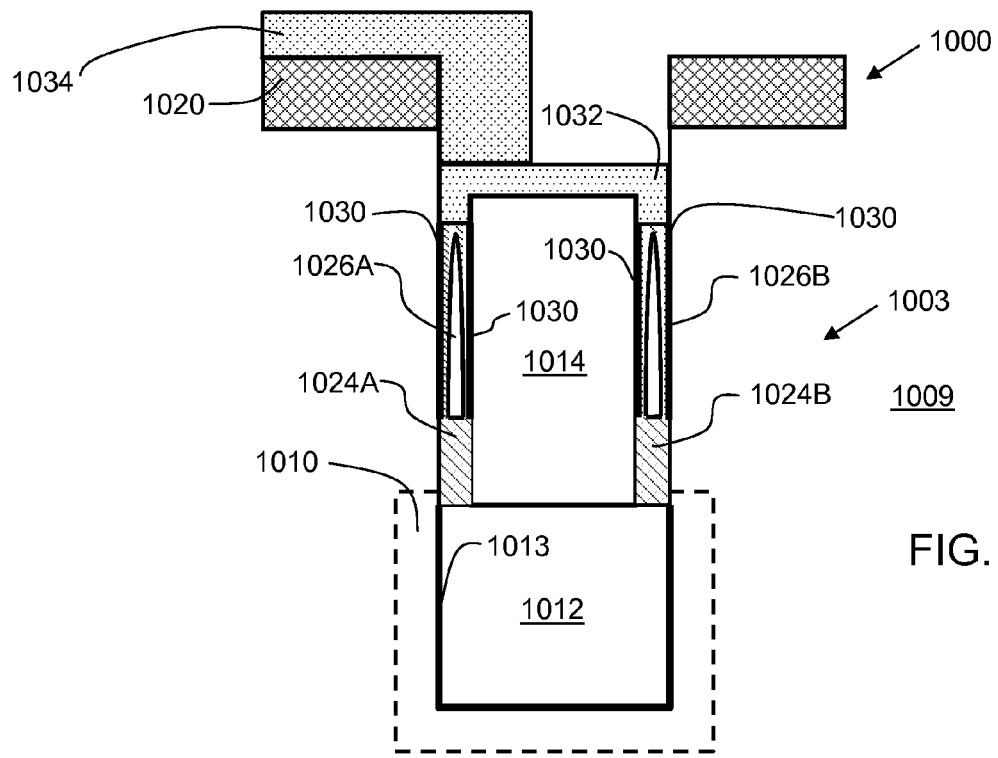

FIG. 10 shows a partially fabricated circuit 1000 after a subsequent processing step. In this step, a masking layer 1034 (e.g., photoresist and/or hardmask) is applied via lithography or combination of lithography and etch (e.g., RIE). The masking layer 1034 protects the area of the trench where the transistor will later connect, while shallow trench isolation (STI) will be formed in the area not covered by the masking layer 1034.

Figure 11:
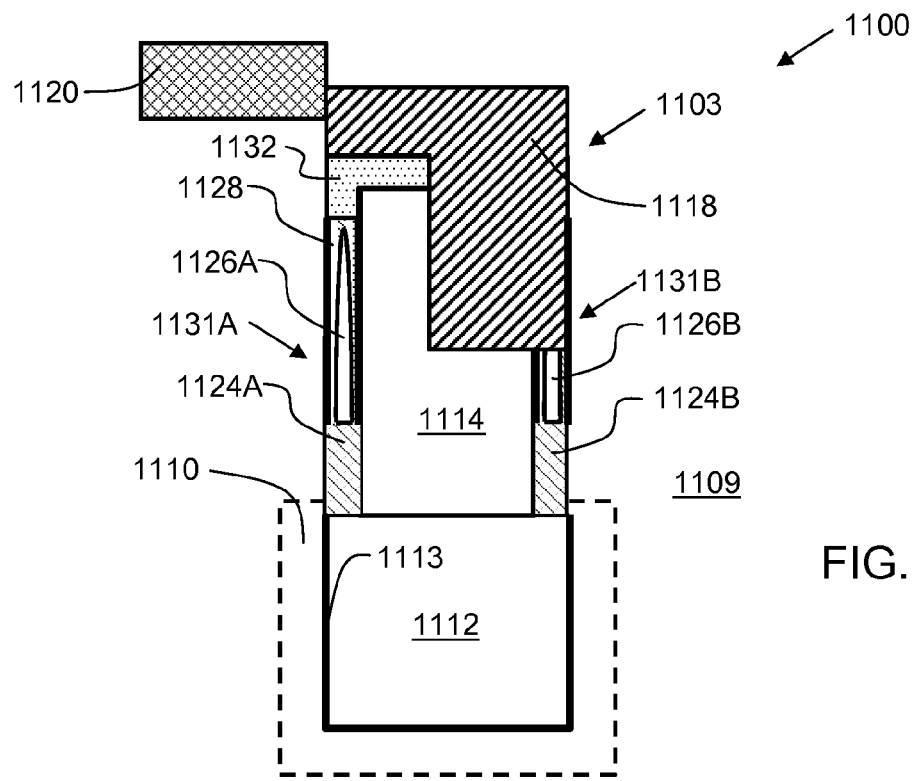

FIG. 11 shows a partially fabricated circuit 1100 after subsequent processing steps. At this point, an etch has created a cavity that is then filled with dielectric material to form STI

1118. Finally the masking layer 1034 (FIG. 10) may be removed at any suitable fabrication step, for example, after etching the cavity but before the filling of the cavity with dielectric material. The collar, comprised of collar portions 1131A and 1131B, now comprises an oxide insulator base layer (1124A, 1124B), and an air gap (1126A and 1126B). The air gap may be surrounded by the non-conformal material 1128. Note that the STI 1118 may breach air gap 1126B. It is also possible that some of the STI material may seep into air gap 1126B. This is permissible, because the collar portion 1131B does not serve to prevent any leakage currents.

FIG. 12 shows the completed circuit 1200, which includes transistor 1202, having buried strap 1204. Buried strap 104 contacts trench conductor 1232, which is in turn contacting trench conductor 1214, providing transistor 1202 with an electrical connection to the trench capacitor 1211, which is comprised of buried plate 1210, polysilicon 1212, and node dielectric 1213.

FIG. 13 is a flowchart 1300 showing process steps to make the trench structure of embodiments of the present invention. In process step 1352, an oxide layer is deposited (see 322 of FIG. 3). In process step 1354, a first etch is performed, creating spacers (see 424A and 424B of FIG. 4). In process step 1356, a conductor is deposited (see 514 of FIG. 5). In process step 1358, a second etch is performed, to create a recess in between the first conductor and the trench walls (see 614 of FIG. 6). In process step 1360, a non-conformal material is deposited, thereby creating air gaps in the collar (see 726A and 726B of FIG. 7). Process step 1360 may be performed by chemical vapor deposition. In process step 1362, a third etch is performed to remove a majority of the non-conformal material, but leaving the air gaps intact (see 826A and 826B of FIG. 8). In process step 1364, standard trench fabrication techniques are utilized to complete the inventive device. This includes depositing an additional trench conductor, and creating a shallow trench isolation (STI) region.

FIG. 14 is a flowchart 1400 showing optional process steps that may be used to make embodiments of the trench structure of the present invention. In process step 1452, an oxide layer is deposited (see 322 of FIG. 3). In process step 1454, a first etch is performed, creating spacers (see 424A and 424B of FIG. 4). In process step 1456, a conductor is deposited (see 514 of FIG. 5). In process step 1458, a second etch is performed, to create a recess in between the first conductor and the trench walls (see 614 of FIG. 6). In process step 1459, an oxide liner is formed, to improve the interface quality between the collar and the adjacent materials (see 730 of FIG. 7). In process step 1460, a non-conformal material is deposited, thereby creating air gaps in the collar (see 726A and 726B of FIG. 7). In process step 1462, a third etch is performed to remove a majority of the non-conformal material, but leaving the air gaps intact (see 826A and 826B of FIG. 8). In process step 1463, a thermal anneal is performed, preferably in the range of about 850-1000 degrees Centigrade for a time ranging from about 10 minutes to about 1 hour. The anneal process helps improve the integrity of the device structure.

Alternatively, the thermal anneal step 1463 may be performed before process step 1462, instead of after process step 1462 as shown in flowchart 1400. In process step 1464, standard trench fabrication techniques are utilized to complete the inventive device. This includes depositing an additional trench conductor, and creating a shallow trench isolation (STI) region.

Embodiments of the present invention provide a trench in which the collar portion now has an air gap instead of a solid oxide collar as is used in the prior art. The air gap provides a lower dielectric constant (ideally the air gap K=1), whereas oxide typically has a K value of about 3.9. Embodiments of the present invention can therefore be used to make higher-performance devices (due to reduced parasitic leakage), or smaller devices, due to the ability to use a thinner collar to achieve the same performance as a thicker collar comprised only of oxide (with no air gap). Alternatively, a design choice can be made to achieve a combination of improved performance and reduced size, depending on the application.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for fabricating a trench structure comprising the steps of:
    forming spacers on trench sidewalls on a trench within a substrate;
    depositing a trench conductor within the trench, whereby the trench conductor is disposed between the spacers;
    removing a portion of the spacers; and
    depositing a non-conformal material, thereby forming a collar, said collar comprising an inner wall and an outer wall, and wherein said collar comprises a cavity, said cavity disposed between the inner wall and outer wall of said collar; and
    removing a portion of the non-conformal material.

2. The method of claim 1, further comprising the step of:
    forming an oxide liner on the trench conductor, and the outer wall of said collar.

3. The method of claim 1, wherein the step of forming spacers on trench sidewalls comprises the steps of:
    depositing an oxide within the trench; and
    performing a first etch of the oxide.

4. The method of claim 1, wherein the step of depositing a non-conformal material is performed via chemical vapor deposition.

5. The method of claim 1, further comprising the step of performing a thermal anneal at a temperature ranging from about 850 degrees Centigrade to about 1000 degrees Centigrade for a duration ranging from about 10 minutes to about 1 hour.

6. The method of claim 5, wherein the step of performing a thermal anneal is performed after the step of removing a portion of the non-conformal material.

7. The method of claim 5, wherein the step of performing a thermal anneal is performed before the step of removing a portion of the non-conformal material.

* * * * *